United States Patent
Hoffmann

(10) Patent No.: US 11,145,665 B2
(45) Date of Patent: Oct. 12, 2021

(54) ELECTRICAL STORAGE DEVICE WITH NEGATIVE CAPACITANCE

(71) Applicant: NaMLab gGmbH, Dresden (DE)

(72) Inventor: Michael Hoffmann, Dresden (DE)

(73) Assignee: NaMLab gGmbH, Dresden (DE)

( * ) Notice: Subject to any disclaimer, the term of this patent is extended or adjusted under 35 U.S.C. 154(b) by 0 days.

(21) Appl. No.: 16/864,370

(22) Filed: May 1, 2020

(65) Prior Publication Data

US 2020/0350324 A1    Nov. 5, 2020

(30) Foreign Application Priority Data

May 2, 2019 (DE) .......................... 102019003223.3

(51) Int. Cl.
| | |
|---|---|
| *H01L 27/11507* | (2017.01) |
| *H01L 29/78* | (2006.01) |
| *H01L 49/02* | (2006.01) |
| *H01L 27/1159* | (2017.01) |

(52) U.S. Cl.
CPC .... *H01L 27/11507* (2013.01); *H01L 27/1159* (2013.01); *H01L 28/60* (2013.01); *H01L 29/78391* (2014.09)

(58) Field of Classification Search
CPC ........... H01L 27/11585; H01L 27/1159; H01L 27/78391; H01L 28/56; H01L 28/60

USPC ......................................................... 257/295
See application file for complete search history.

(56) References Cited

U.S. PATENT DOCUMENTS

| | | | |
|---|---|---|---|
| 10,210,921 B1* | 2/2019 | Hwang | G11C 11/2255 |
| 2004/0256648 A1* | 12/2004 | Karasawa | H01L 27/11502 257/295 |
| 2006/0118844 A1* | 6/2006 | Kijima | H01L 29/40111 257/295 |
| 2011/0149633 A1* | 6/2011 | Ahn | H01L 29/8615 365/145 |
| 2017/0062037 A1* | 3/2017 | Nicholes | G11C 11/5657 |
| 2018/0358471 A1* | 12/2018 | Yoo | G11C 13/0011 |
| 2020/0212168 A1* | 7/2020 | Yoo | H01L 28/60 |

* cited by examiner

*Primary Examiner* — Matthew E Warren
(74) *Attorney, Agent, or Firm* — Edell, Shapiro & Finnan, LLC

(57) ABSTRACT

The energy density of capacitors can be increased by using a material with differential negative capacitance (NC), which was recently observed in FE materials. Described is a more general pathway towards improved electrostatic energy storage densities by engineering the capacitance non-linearity of electrostatic devices. The disadvantages of regular polarizable materials are overcome by using the NC effect, which ideally has no hysteresis losses, leading to a theoretical efficiency of 100%. By storing the energy mostly in an amorphous DE layer, the break-down field strength is much higher compared to pure FE or AFE storage capacitors. In addition, leakage current losses can be reduced by improving the morphology of the insulating materials used.

23 Claims, 14 Drawing Sheets

ELECTRICAL STORAGE DEVICE WITH NEGATIVE CAPACITANCE

CROSS REFERENCE TO RELATED APPLICATIONS

This application claims foreign priority under 35 U.S.C. § 119(a)-(d) to Application No. DE 102019003223.3 filed on May 2, 2019, the entire contents of which are hereby incorporated by reference.

BACKGROUND

Increasing amounts of electrical energy need to be stored efficiently in the future due to a shift towards decentralized generation and consumption. Electrostatic capacitors can achieve very high power densities compared to other storage technologies like batteries. However, the energy densities of such capacitors are comparatively low. When a voltage is applied to a capacitor (see FIGS. 1a, 1b), energy is stored in the electric field in a dielectric material (105), which separates the two conducting electrodes (101, 102). The major advantages of the energy storage in capacitors are a high energy storage efficiency, temperature and cycling stability as well as fast charging and discharging. Nevertheless, regular dielectric capacitors cannot compete with the orders of magnitude higher energy storage densities (ESD) of, e.g., batteries. Electrochemical supercapacitors, which combine the high power density of regular capacitors with higher energy densities, are ideal for applications where a large amount of electrical energy has to be stored and released in a short time. Such supercapacitors are currently used, e.g., to stabilize the power grid, recover braking energy in electric vehicles or provide a backup power supply for critical electrical systems.

In the past, electrostatic energy storage capacitors based on polarizable materials instead of dielectric (DE) materials have been proposed to overcome the limitations in ESD. Prior art energy storage capacitors based on single layers of ferroelectric (FE), antiferroelectric (AFE) and relaxor-like ferroelectric materials (RFE) still have several drawbacks. First, due to hysteretic switching, energy is dissipated during charging and discharging, which reduces the energy storage efficiency (see FIGS. 2a, 2b, and 2c). Secondly, due to their crystalline structure, the breakdown field strength of FE and AFE materials is limited compared to amorphous DE materials with a high electronic band gap.

Besides energy storage applications, stored energy can be interpreted as stored information. A known concept for stored energy used as information storage in capacitor structures are DRAMs (dynamic random access memory) using high or low charge as information storage. This is called a volatile memory structure because the stored data is lost within seconds and has to be refreshed in time to secure data storage mainly due to leakage current issues. Another example are NAND Flash memories using a floating gate or charge trapping layer for information storage in a transistor structure.

Polarizable materials have seen a significant increase of attraction for being used for information storage in memory applications. Prominent examples for this type of memories are ferroelectric memory structures like FeRAM (ferroelectric random access memory) and FeFET (ferroelectric field effect transistor) devices.

SUMMARY

This invention describes a concept to increase the energy density of capacitors by using a material with differential negative capacitance (NC), which was recently observed in FE materials. Moreover, the invention shows a more general pathway towards improved electrostatic energy storage densities by engineering the capacitance non-linearity of electrostatic devices. The invention disclosed herein overcomes the disadvantages of regular polarizable materials by using the NC effect, which ideally has no hysteresis losses, leading to a theoretical efficiency of 100% (see FIG. 2d). Furthermore, by storing the energy mostly in an amorphous DE layer, the breakdown field strength is much higher compared to pure FE or AFE storage capacitors. In addition leakage current losses can be reduced by improving the morphology of the insulating materials used.

In accordance with this invention the improved electrostatic energy storage density by engineering the capacitance non-linearity of electrostatic capacitors is used for energy storage application as an energy storage element and for data and information storage and processing applications as an integrated circuit element.

BRIEF DESCRIPTION OF THE DRAWINGS

FIG. 2a shows the charge-voltage characteristics of a ferroelectric, FIG. 2b shows the charge-voltage characteristics of an antiferroelectric, FIG. 2c shows the charge-voltage characteristics of a relaxor-like ferroelectric, and FIG. 2d shows the charge-voltage characteristics as disclosed herein the ferroelectric/dielectric capacitor.

FIGS. 5a-5c show planar structures, FIG. 5d shows a 3D structure to improve energy storage density, and FIG. 5e shows a planar structure combined with a charge and load element (530).

FIG. 6a illustrates an example implementation of the inventive concept using a memory cell architecture based on a capacitor integration. FIG. 6b illustrates an example implementation of the inventive concept using a memory cell architecture based on a transistor integration.

DETAILED DESCRIPTION

Figure 1B:
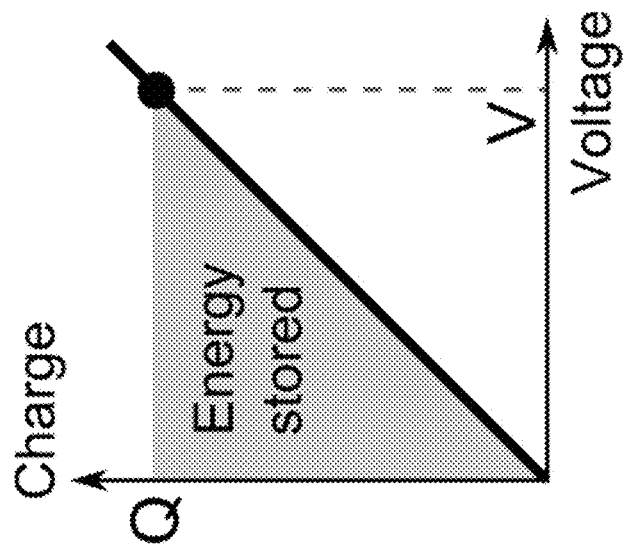
FIG. 1b is a graph showing energy stored in a linear positive capacitor at a certain voltage V is given by the area above the charge-voltage curve.
Figure 1A:
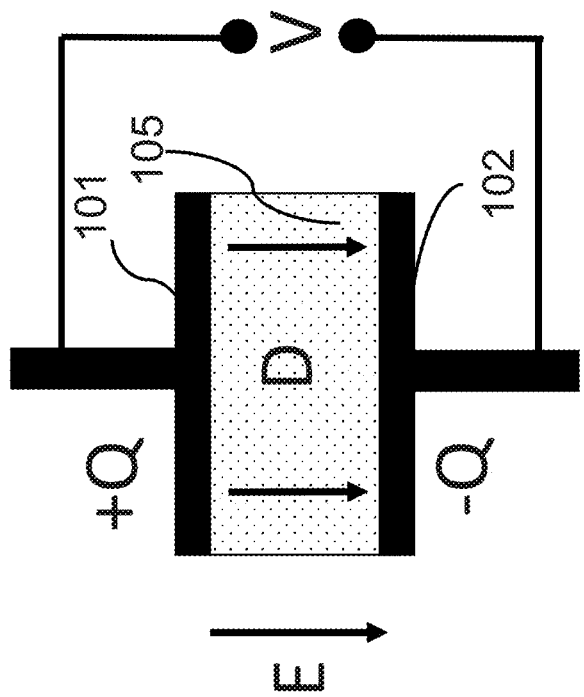
FIG. 1a illustrates a positive capacitor with charge Q, voltage V, electric field E and displacement field D.
Figure 1D:
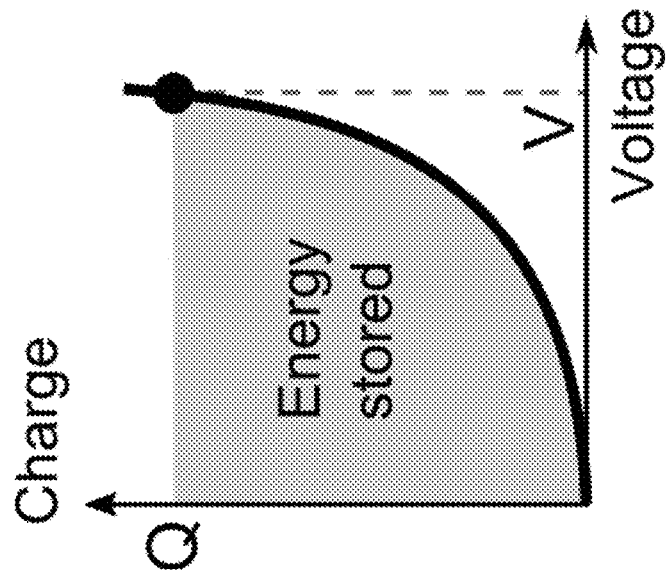
FIG. 1d is a graph of voltage versus charge for the device of FIG. 1c, showing improved energy density and without hysteresis.
Figure 1C:
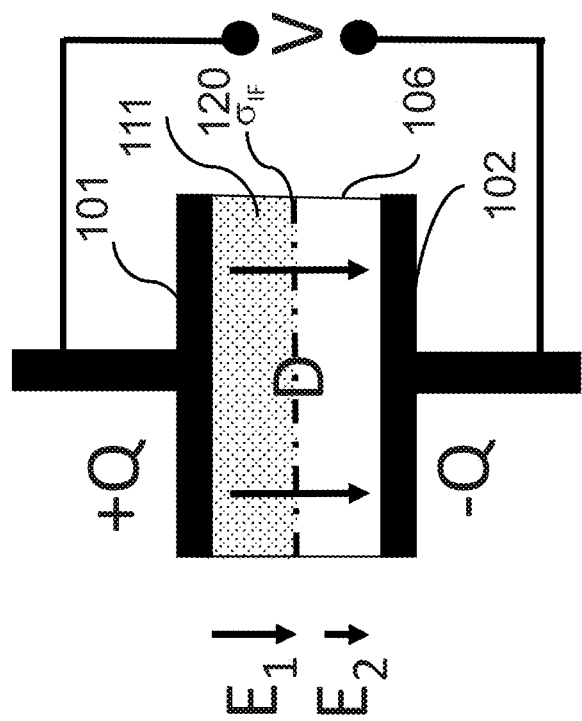
FIG. 1c illustrates a device arrangement combining layers with negative and positive capacitance to create an NC capacitor.

Described herein is a new concept for a capacitor element (see FIG. 1c) that utilizes a stack of insulating layers (111,106), one of which has a differential NC (111) while the other have a positive capacitance (PC) (106). Insulators that exhibit differential NC are polarizable materials e.g. ferroelectric (FE) or antiferroelectric (AFE) materials, while regular dielectric (DE) materials only exhibit PC. Depending on the electrical boundary conditions, NC materials can also be in a PC state. The inventive concept disclosed herein enables a very high electric energy storage density (ESD) with high efficiency in a capacitor consisting of two electrodes (101,102), separated by a stack of a polarizable and a dielectric insulating layer (111,106). When the voltage across the capacitor electrodes is zero, the polarizable layer (111) is in a PC state, resulting in a low total capacitance of the device. When a certain positive voltage is applied across the electrodes, the polarizable layer (111) enters a NC state, which leads to a significant increase of the total capacitance of the device. The increase of the total capacitance with increasing voltage, as well as the improved breakdown field strength of the DE layer (106) due to the polarizable layer (111), leads to a very high ESD (FIG. 1d).

Figure 2B:
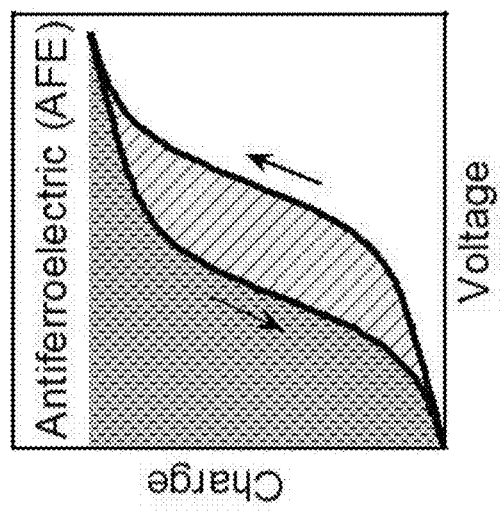
FIGS. 2a-2d show a comparison of different capacitor concepts using polarizable materials. Striped areas correspond to the energy lost due to hysteresis.
Figure 2A:
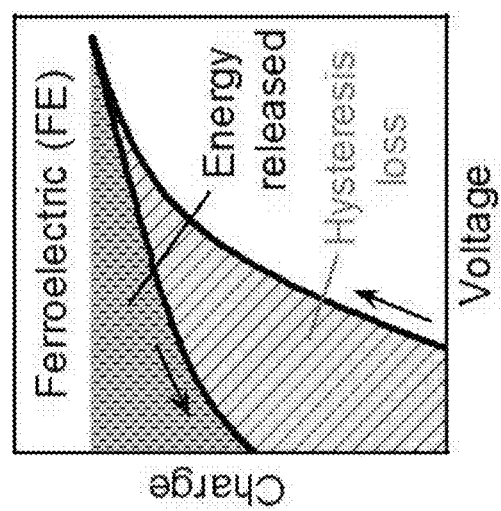

Graphically, the stored energy or stored energy density coincides with the area above the charge—voltage (Q-V) curve as shown in FIGS. 2a-2d or in the electric field—electric displacement field (E-D) curve. For a linear positive devices such as capacitors with a linear dielectric relation $D=\varepsilon E$, where $\varepsilon$ is the permittivity, the capacity is constant and the charge stored depends linear from the voltage (Q=CV) as shown in FIG. 2a. For negative capacitance (NC) materials, the relationship between Q and V (or D and E) cannot be linear, since such a device could supply infinite amounts of energy.

Figure 2D:
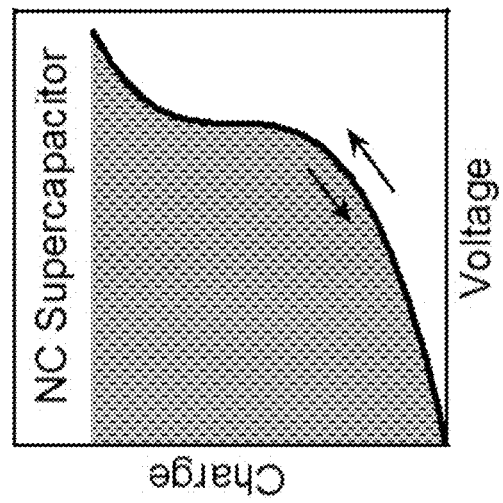
Figure 2C:
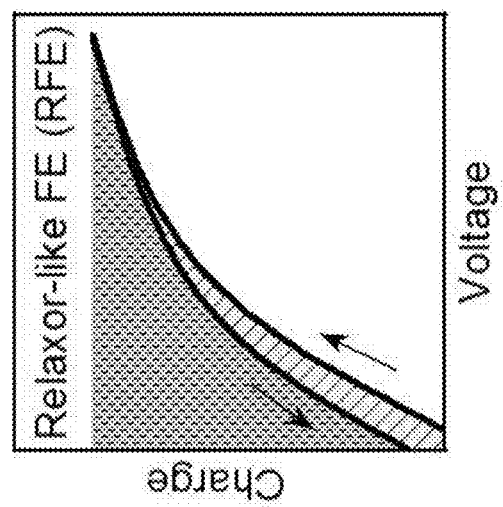

Materials which show a differential negative permittivity (dD/dE<0) or capacitance (dQ/dV<0) can exist if the NC region is bounded by regions of positive capacitance. The simplest way to describe the behavior of a negative capacitance (NC) materials is a $3^{rd}$ order polynomial, which is shifted along the charge axis. Combining a linear capacitance material (V=Q/C) with an NC material described by a $3^{rd}$ order polynomial in series (see FIG. 1d), still a $3^{rd}$ order polynomial describes the capacitance of the two materials. An exemplary Q-V curve of such an NC capacitor with a stack of a polarizable and a dielectric insulating layer is shown in FIG. 2d under the consideration that such a capacitor has no Q-V hysteresis. The curve in FIG. 2d confirms the stable behavior of such a device explicitly.

The invention disclosed herein is different from prior art in that is has a theoretical efficiency of 100% and can store most of the energy or information in the dielectric layer and not in the polarizable layer. This can be seen in the schematic Q-V characteristics shown in FIGS. 2a-2d, which emphasizes the conceptual advantage of using an NC capacitor. While regular ferroelectrics with significant remanent polarization (FIG. 2a) have a rather low ESD and efficiency due to the large hysteresis, antiferroelectrics (FIG. 2b) or relaxor-like ferroelectrics (FIG. 2c) have both improved efficiency and ESD, since the remanent polarization is much lower at comparable maximum polarization charge. The highest efficiency and ESD is achieved by the new concept for energy or information storage in a capacitor that utilizes a stack of insulating layers, one of which has a differential negative capacitance (NC) while the others have a positive capacitance (PC) (FIG. 2d).

In accordance with this invention the improved electrostatic energy storage density by engineering the capacitance non-linearity of electrostatic capacitors is used for energy storage applications as an energy storage element. In accordance with this invention and without restrictions the improved electrostatic energy storage density by engineering the capacitance non-linearity of the electrostatic behavior of devices is used with integrated circuits element for data and information storage and processing applications.

With this embodiment an energy or information storage element comprises a first electrode, a second electrode, a first dielectric layer having positive capacitance disposed between the first and the second electrode layer and a second dielectric layer adjacent to the first dielectric layer comprising a polarizable material. Preferable for some application the second dielectric layer comprising a polarizable material is being thicker than 3 nm. Preferable for the same or other application the first dielectric layer is being thicker than the second dielectric layer. In the embodiment the polarizable material is at least partially in a differential negative capacitance state when a voltage is applied to the electrodes.

In one embodiment of an energy or information storage device the polarizable material is a ferroelectric material and at the interface between the first and the second dielectric layer fixed positive or negative charges are located, with a charge density on the order of the remanent polarization of the ferroelectric material. For some ferroelectric materials the amount of charges located between the first and the second dielectric layer is of the range between 5 μC/cm² and 100 μC/cm². In another embodiment the polarizable material is an anti-ferroelectric or relaxor type material with no charges or charges less than 1 μC/cm² located between the first and the second dielectric layer.

Figure 3A:
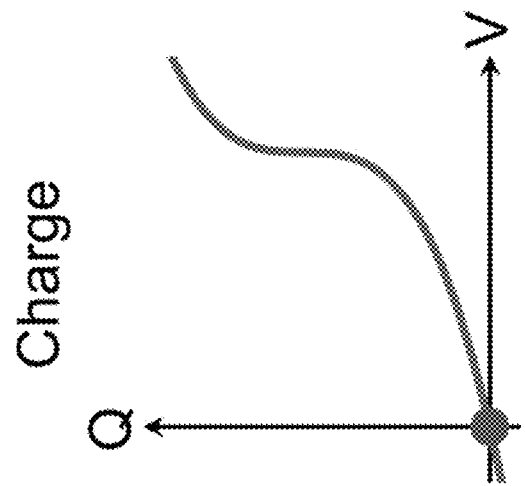
FIG. 3a illustrates a proposed NC capacitor consisting of a ferroelectric/dielectric stack with interfacial charge $\sigma_{IF}$, which stabilizes the spontaneous polarization $P_f$ at zero voltage.
Figure 3A:
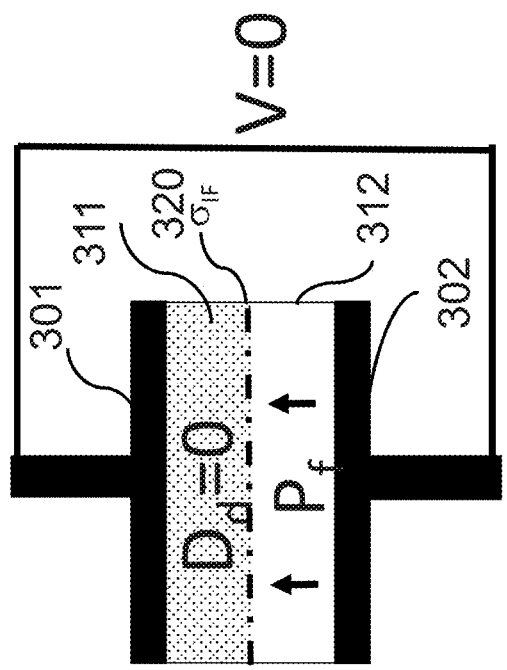

In one embodiment the polarizable material described before is a ferroelectric material and the stack consists of a ferroelectric (312) and a dielectric layer (311) (FIG. 3a). In case of the FE/DE stack, fixed or interfacial charges $\sigma_{IF}$ (320) are introduced at the interface between the FE and the DE layer to stabilize the PC state in the FE layer when the voltage is zero. In this way, depolarization fields in the FE layer are strongly reduced. In the DE film the displacement field is zero ($D_d=0$). This fixed charge at the interface between the layers is comparable to the spontaneous polarization $P_f$ of the FE layer. The fixed charges can be of positive or negative polarity, depending on the direction of the ferroelectric polarization. For negative fixed charges, $P_f$ points towards the interface (320) and for positive fixed charges, $P_f$ points away from the interface. The amount of fixed charges should be matched to the size of the spontaneous polarization $P_f$ when no voltage is applied. The fixed charges (320) at the interface of the ferroelectric material (312) with the NC effect and the dielectric material (311) can be achieved e.g. by electrons trapped at deep energetic defect states at the interface. In another embodiment a lattice mismatch of the FE and DE materials introduces these charges. In another embodiment lattice defects cause free valances of the atoms at the interface introducing these free charges. In another embodiment doping of the polarizable material with the NC effect or the dielectric material at the interface with a dopant having a higher or lower valences compared to the material with the NC effect or the dielectric material introduce these charges.

By closely matching the capacitances of the NC of the FE layer to the PC of the DE layer, the highest ESD can be achieved. This can be done, e.g. by changing the thickness of the FE and DE layer or by using materials with different relative permittivity. Additionally, increasing the thickness of the DE layer with respect to the FE layer, will increase the ESD since most of the energy is stored in the DE layer, more than 50% and typically more than 80%.

In another embodiment the polarizable material is a stack of an antiferroelectric material and the stack consists of an antiferroelectric and a dielectric layer. In case of the AFE/DE stack, fixed charges should not be introduced at the interface between the AFE and the DE layers since at zero applied voltage, the AFE material is always in a PC state. By closely matching the capacitances of the NC of the AFE layer to the PC of the DE layer, the highest ESD can be achieved. This can be done, e.g. by changing the thickness of the AFE and DE layers or by using materials with different relative permittivity. Additionally, increasing the thickness of the DE layer with respect to the AFE layer, will increase the ESD since most of the energy is stored in the DE layer.

The new concept for an energy storage element that utilizes a stack of insulating layers, one of which has a differential negative capacitance (NC) while the others have a positive capacitance (PC) can be used in memory cells for data or information storage as well. Insulators that exhibit differential NC are polarizable materials e.g. ferroelectric (FE) or antiferroelectric (AFE) materials, while regular dielectric (DE) materials only exhibit PC. In accordance with this invention most of the information of the memory cell is stored the dielectric materials (typically more than 80%). Only a smaller portion is stored in the polarizable material.

With this embodiment an integrated circuit element comprises a first electrode, a second electrode, a first dielectric layer having positive capacitance disposed between the first and the second electrode layer and a second dielectric layer adjacent to the first dielectric layer comprising a polarizable material and the second dielectric layer being thicker than the first dielectric layer. In this embodiment the polarizable material which is the part of the second dielectric layer is at least partially in a differential negative capacitance state when a voltage is applied to the electrodes.

In one embodiment of an integrated circuit element the polarizable material is a ferroelectric material and at the interface between the first and the second dielectric layer fixed positive or negative charges a located, with a charge density on the order of the remanent polarization of the ferroelectric material. In another embodiment the polarizable material is an anti-ferroelectric or relaxor type material and charges less than 1 $\mu C/cm^2$ are located between the first and the second dielectric layer.

One embodiment of the invention of an integrated circuit element is a capacitor structure, a second embodiment is a transistor structure. Both structure are used for storage and logic devices. Therefor one embodiment of the integrated circuit element is a storage device, another embodiment is a logic device. Additionally, the integrated circuit element is used as a piezoelectric device, as a pyroelectric device or an energy storage device.

In one embodiment of the storage device in a memory cell the polarizable material is a ferroelectric material and the stack is of a ferroelectric and a dielectric layer. In case of the FE/DE stack, fixed charges are introduced at the interface between the FE and the DE layer to stabilize the PC state in the FE layer when the voltage is zero. In this way, depolarization fields in the FE layer are strongly reduced. By closely matching the capacitances of the NC of the FE layer to the PC of the DE layer, the highest amount of charges stored can be achieved. This can be done, e.g. by changing the thickness of the FE and DE layer or by using materials with different relative permittivity. For typical ferroelectric materials like doped $HfO_2$ the amount of charges located between the first and the second dielectric layer is of the range between 5 $\mu C/cm^2$ and 50 $\mu C/cm^2$.

In another embodiment of the memory cell the polarizable material is a stack of an antiferroelectric material and the stack is of an antiferroelectric and a dielectric layer. In case of the AFE/DE stack, fixed charges do not have to be introduced at the interface between the AFE and the DE layers since at zero applied voltage, the AFE material is always in a PC state. For typical antiferroelectric materials like $ZrO_2$ or Si doped $HfO_2$ the amount of charges located between the first and the second dielectric layer is less than 1 $\mu C/cm^2$. By closely matching the capacitances of the NC of the AFE layer to the PC of the DE layer, the highest amount of charges stored can be achieved. This can be done, e.g. by changing the thickness of the AFE and DE layers or by using materials with different relative permittivity.

Figure 3B:
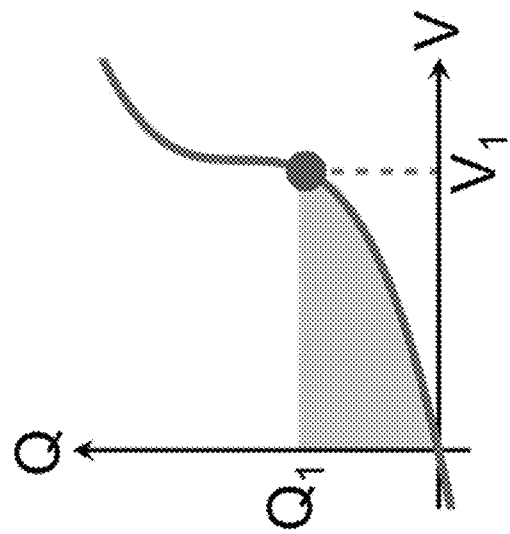
FIG. 3b illustrates an NC capacitor under application of a positive voltage $V_1$, where the ferroelectric layer is still in the positive capacitance (PC) regime.
Figure 3B:
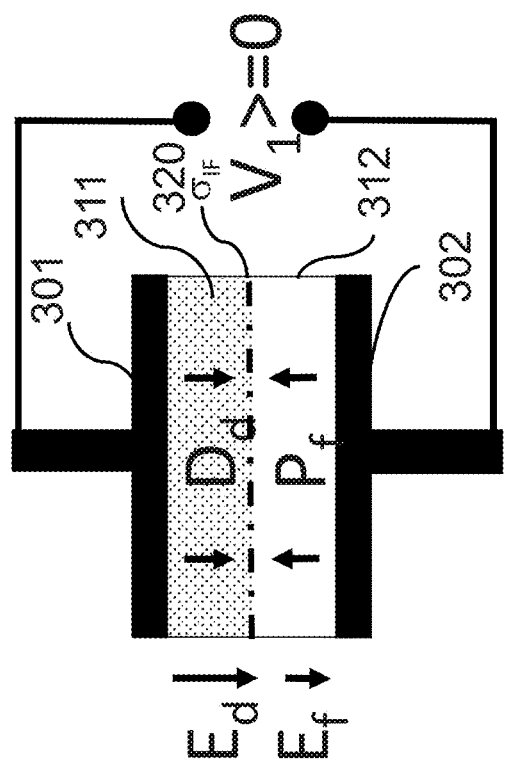
Figure 3C:
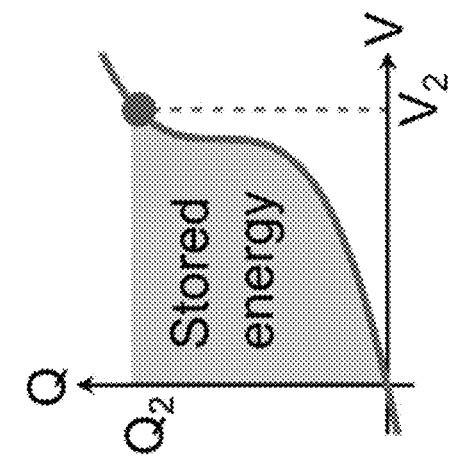
FIG. 3c illustrates an NC capacitor under application of a higher positive voltage $V_2 > V_1$, where the ferroelectric is in the NC regime. Due to the NC in the ferroelectric layer, the stored energy (gray area) is significantly enhanced.
Figure 3C:
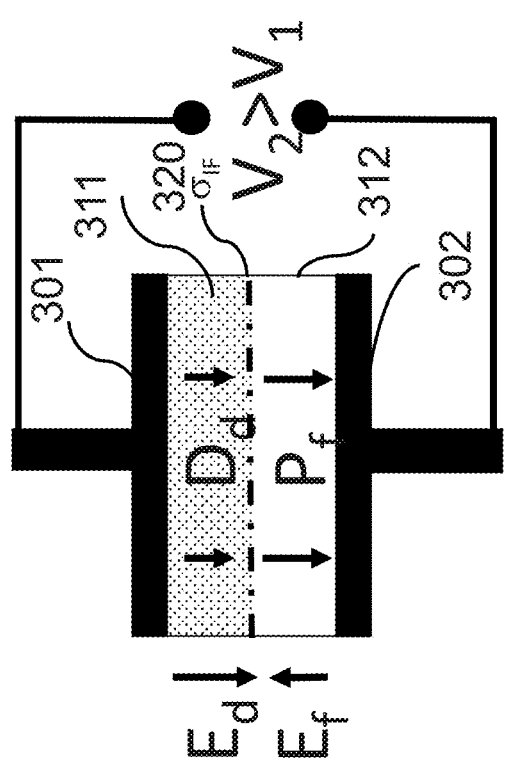

By applying a positive voltage $V_1$ to a FE/DE capacitor as described previously and shown in FIG. 3b, the ferroelectric polarization $P_f$ increases only slowly in the positive capacitance regime which leads to a rather small increase of the charge Q and thus the stored energy with increasing voltage. Here, the FE layer is in its PC regime. However, the total capacitance is increasing with increasing voltage. By further increasing the voltage towards $V_2 > V_1$, as shown in FIG. 3c, the FE material enters the NC region, where a small change in external voltage leads to a large increase in the charge and thus also in the stored energy. The electric field inside the dielectric ($E_d$) is amplified while the field inside the ferroelectric ($E_f$) is moderate, even changing sign in this example. Ideally, the NC capacitor should be operated in this region, since the voltage amplification effect will be reduced for larger voltages, where the ferroelectric enters its second PC region.

One example of an embodiment of the NC capacitor is a metal-ferroelectric-insulator-metal (MFIM) capacitor using ferroelectric $Hf_{0.5}Zr_{0.5}O_2$ (HZO) layer and dielectric layer of $Ta_2O_5$ thin films as described. The metal-ferroelectric-insulator-metal (MFIM) capacitors can be fabricated on substrates like Si substrates with a native $SiO_2$ layer. Bottom electrodes are from TiN with a thickness in the rage between 10 and 100 nm. In a specific embodiment described herein a thickness of 12 nm is used. TiN can reactively sputtered in a physical vapor deposition tool at room temperature. Subsequently, $Hf_{0.5}Zr_{0.5}O_2$ (HZO) films are grown by atomic layer deposition (ALD) at a temperature between 200° C. and 300° C. In a specific embodiment described herein a temperature of 260° C. has been used. As precursors for the ALD growth of the HZO film TEMA-Hf and TEMA-Zr are used. As the oxygen source water or ozone can be used. Alternating ALD cycles of TEMA-Hf and TEMA-Zr should be applied to achieve a homogeneous distribution of Hf and Zr in the films. The $Ta_2O_5$ file can be fabricated by reactive sputtering of $Ta_2O_5$ at room temperature after ALD of HZO. Top TiN electrodes can be deposited in the same way as the bottom electrodes. After top electrode deposition, crystallization of the HZO layers will be achieved by annealing the samples. Preferable annealing will be at 500° C. for 20 s in nitrogen atmosphere for $Ta_2O_5$. Etching of the capacitor can be achieved either by wet or plasma assisted gas etching.

FIGS. 4a-4d show experimental data for a TiN/HZO/$Ta_2O_5$/TiN capacitor as described before using a pulsed electrical measurement technique. The integrated charges during charging (open symbols, $Q_c$) and discharging (full symbols, $Q_d$) are shown as a function of the applied voltage in FIG. 4b. By integrating the area above the Q-V curve, the energy necessary to charge the capacitor (open symbols, $W_c$) and the recovered energy during discharging (full symbols, $W_d$) are calculated, which can be seen in FIG. 4c. The energy storage efficiency can then be calculated as $$\text{Efficiency} = (W_c - W_d)/W_c \qquad (1)$$

Figure 4B:
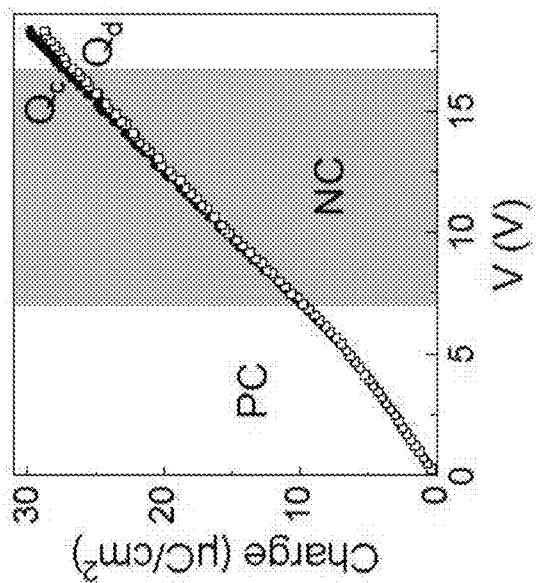
FIG. 4b is a graph showing measured charges as a function of the applied voltage during charging (solid line, $Q_c$) and discharging (open symbols, $Q_d$).
Figure 4A:
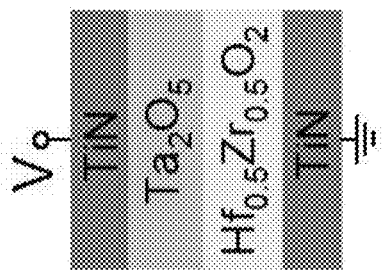
FIG. 4a illustrates an NC capacitor sample structure using a $Ta_2O_5$ dielectric and a $Hf_{0.5}Zr_{0.5}O_2$ ferroelectric layer. To measure the stored charge, voltage pulses V are applied at the top electrode.
Figure 4D:
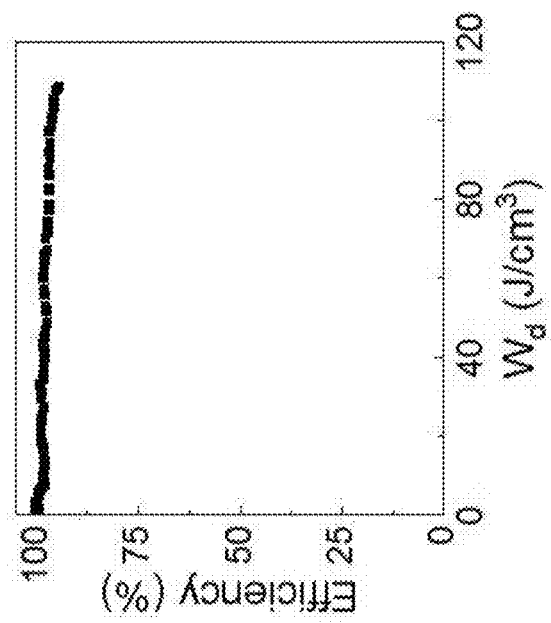
FIG. 4d is a graph showing energy storage efficiency as a function of the discharged energy density $W_d$.
Figure 4C:
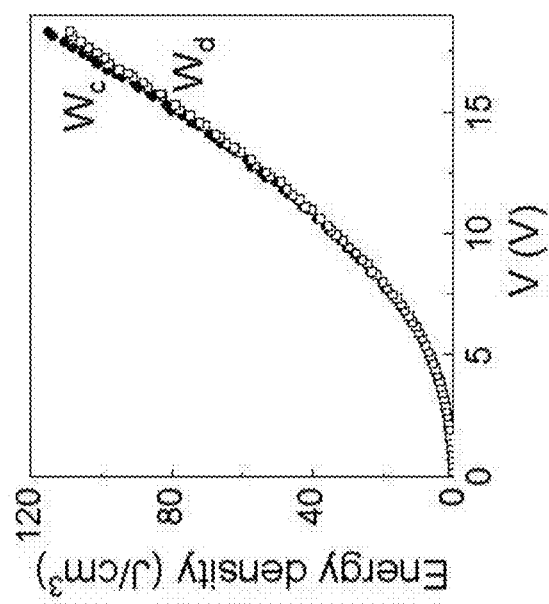
FIG. 4c is a graph showing the energy densities during charging (full symbols, $W_c$) and discharging (open symbols, $W_d$) as a function of the voltage V.

When examining the efficiency as a function of the discharged energy density as shown in FIG. 4d, even for very high densities above 100 J/cm³, efficiencies above 95% can be obtained.

Figure 5C:
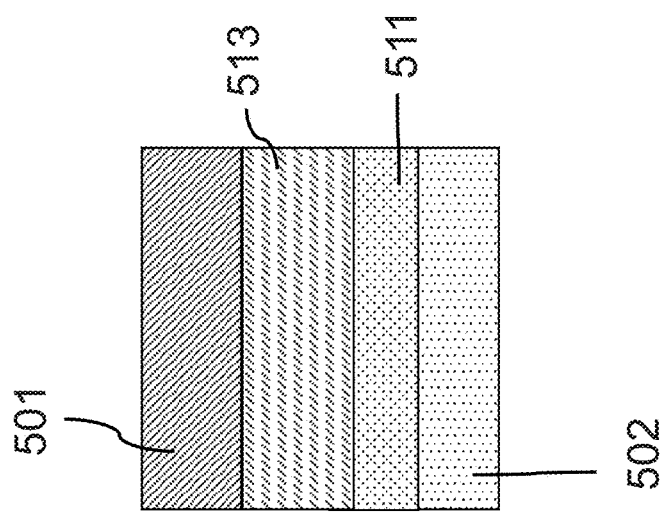
FIGS. 5a-5e illustrate different structures for energy storage and memory applications in accordance with this invention.
Figure 5B:
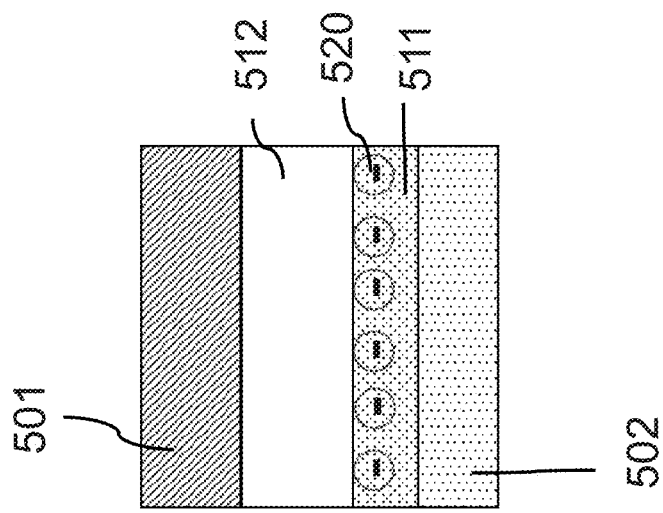
Figure 5A:
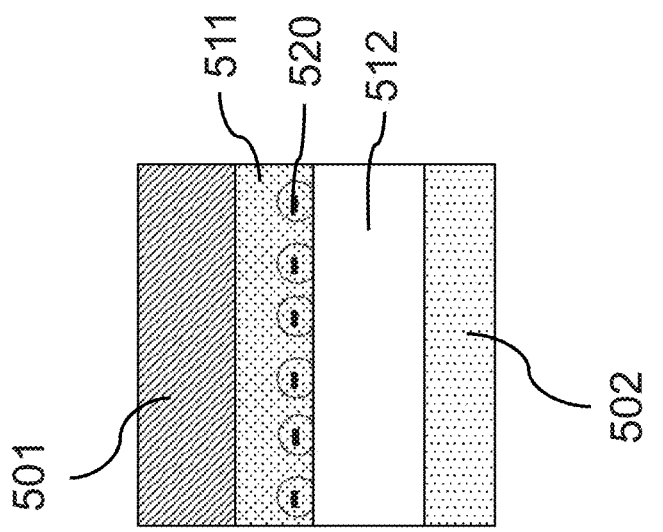

Different structures for energy storage and memory applications are in accordance with this invention. Commonly planar structures are used as shown in FIGS. 5a to 5c. With this embodiment material that exhibit differential NC effect (512) is positioned below (FIG. 5a) or above (FIG. 5b) the material that exhibits a PC (511), both located between an upper electrode (501) and a lower electrode (502). In this embodiment the polarizable material that exhibits the differential NC effect is a ferroelectric material (512) and at the interface to the material that exhibits a PC (511), negative charges (520) are located. In another embodiment, fixed positive charges are located at the interface instead of the negative charges (520).

FIG. 5c describes an embodiment with an antiferroelectric material that exhibits the differential NC effect (513).

It is understood that additional layers between the electrodes and the polarizable material that exhibits the differential NC effect and between the electrodes and the material that exhibits a PC can be used to improve the reliability of the NC capacitor or to reduce charge trapping effects. Further it is understood, that an interlayer in between the polarizable material that exhibits the differential NC effect can be used, forming multilayers to improve the polarizability of the material. Additionally the material that exhibit the PC effect can be of different materials and or different layers to improve the reliability or the energy density of the NC capacitor, e.g. a stack of two PC layers where one PC layer has a very high electronic band gap while the other PC layer has a very high relative permittivity.

Figure 5D:
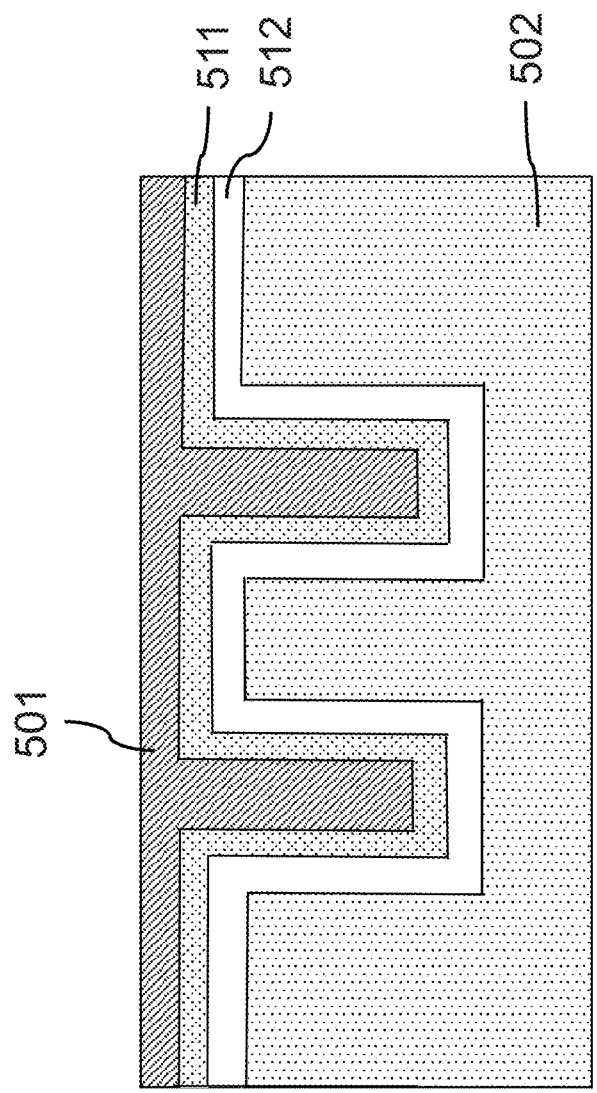

Materials described herein are processed most advantageous as thin films. To improve the energy storage density, 3D structures are used. FIG. 5d shows a 3D structure of such an embodiment as a cross section. From top to down the structure can look like a circle, an oval, a trench or any other type of 3D structure. With this embodiment, the material that exhibits the differential NC effect (512) is positioned below the material that exhibit PC effect (511). For other embodiments of 3D structures the material that exhibits the differential NC effect is positioned above the material that exhibits the PC effect. Both are located between an upper electrode (501) and a lower electrode (502). In this embodiment the polarizable material that exhibits the differential NC effect is a ferroelectric material (512) and at the interface to the material that exhibit PC effect (511) negative charges (520) are located. In another embodiment using a ferroelectric material that exhibits a NC effect positive charges are positioned at the interface to the material that exhibits the PC effect. In another embodiment, an antiferroelectric layer is used instead of the ferroelectric layer (512) and no charges are present at the interface to the PC layer.

Figure 5E:
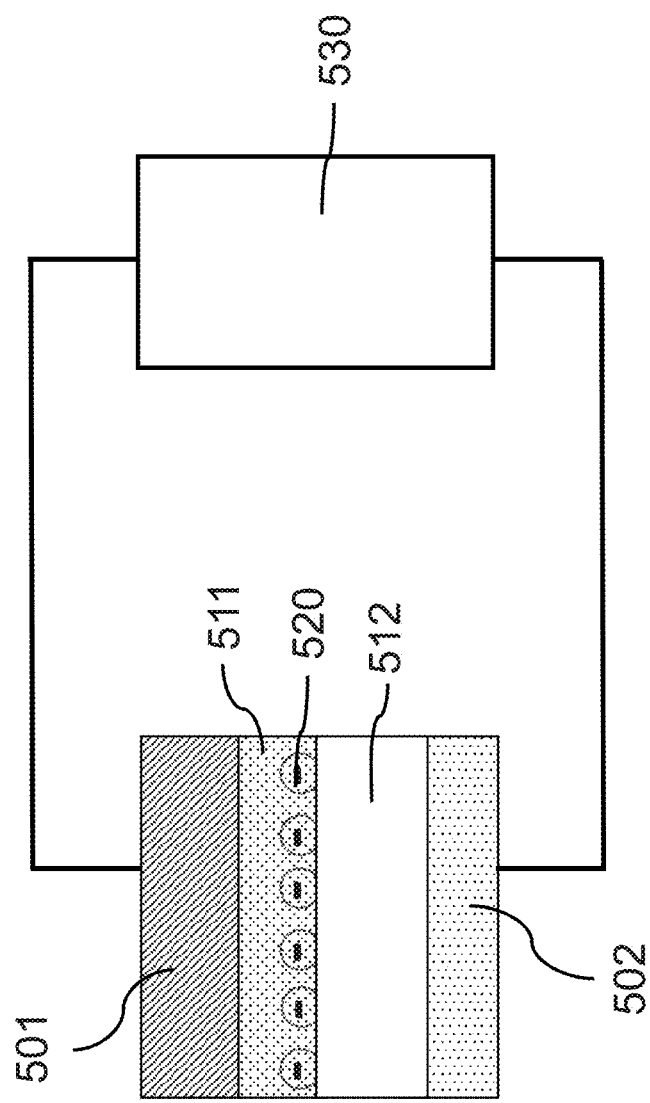

In FIG. 5e, an energy storage cell is plotted as an application for charging systems using electrical energy combined with a charge and load element used to charge devices and to recharge the energy storage cell. In this embodiment the polarizable material that exhibits the differential NC effect is a ferroelectric material (512) and at the interface to the material that exhibit PC effect (511) negative charges (520) are located. The upper electrode (501) and a lower electrode (502) are connected to a charge and load unit (530).

Figure 6A:
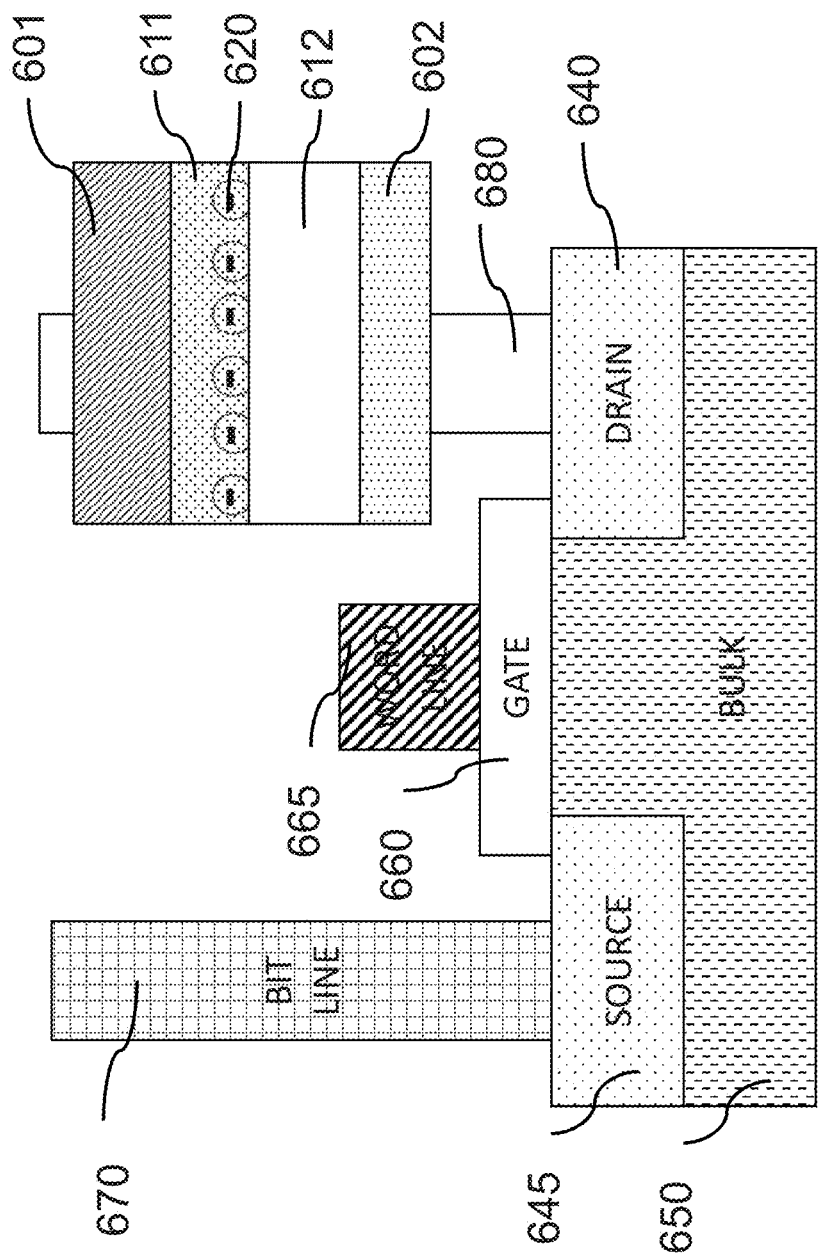
FIGS. 6a and 6b illustrate example implementations of the inventive concept in memory cells.
Figure 6B:
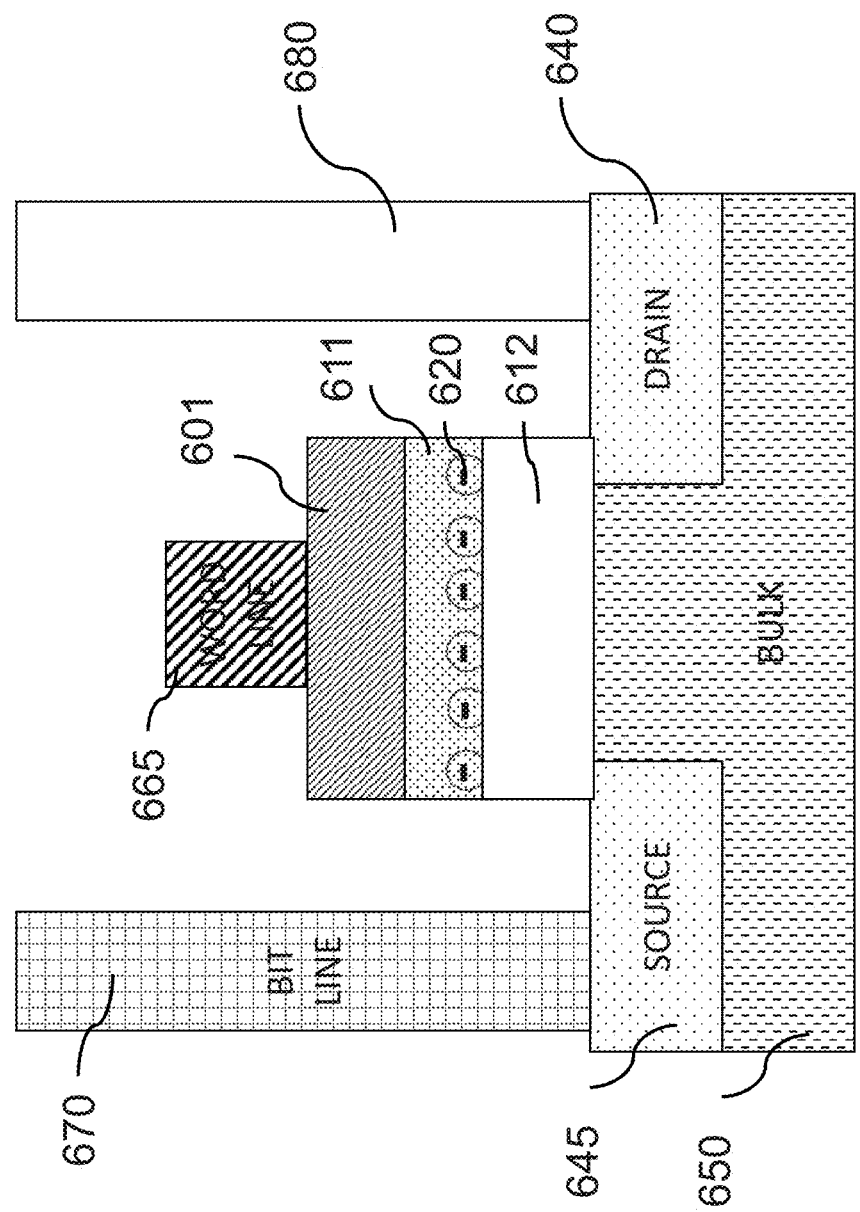

FIGS. 6a and 6b illustrate two examples of inventive memory application concepts based a capacitor and transistor integration. FIG. 6a illustrates a cross-sectional view of one embodiment of an integrated circuit with reference to the inventive concept described herein, including a planar one transistor—one capacitor (1T-1C) memory cell using a polarizable material that exhibits the differential NC effect and a dielectric material that exhibits a PC. The memory cell includes source/drain regions (640, 645) formed within a bulk carrier (650) such as a silicon substrate. Over a surface of the carrier (650), a gate layer stack (660) is formed, which extends between source region (645) and drain region (650). A bit line (670) is formed on top of the source region (645), and a word line (665) is formed on top of gate layer 660. A storage element in accordance with the inventive concept described herein is coupled by a contact (680) to the drain region (640). In particular, in this embodiment the polarizable material that exhibits the differential NC effect is a ferroelectric material (612) and at the interface to the material that exhibit PC effect (611) negative charges (620) are located. Thus, the storage element is formed in accordance with the arrangement shown in FIG. 6a.

FIG. 6b illustrates a cross-sectional view of one embodiment of an integrated circuit with reference to the inventive concept described herein, including a planar one transistor (1T) memory cell in which the storage layer is incorporated into the gate stack. As with the structure shown in FIG. 6a, the memory cell of FIG. 6b includes source/drain regions (645), (640) formed within a bulk carrier (650), and a bit line (670) formed on top of the source layer (645). In this embodiment the polarizable material that exhibits the differential NC effect is a ferroelectric material (612) and at the interface to the material that exhibit PC effect (611) negative charges (620) are located. The material that exhibit PC effect (611) forms a layer on the surface of a carrier layer (650), extending between source regions (645) and drain region (640). A metal electrode (601) is formed on top of ferroelectric layer (620), and a word line is formed on top of metal electrode (665). In this manner, the structure shown in FIG. 6b is incorporated into the gate stack and formed by carrier layer (650), an insulating layer (620), partially using a polarizable material that exhibits the differential NC effect, an insulating layer using a dielectric material that exhibits the PC effect (612) and metal electrode (601).

The electrodes of the embodiments described herein can comprise any one or more suitable conductive metals including, without limitation, TiN, TaN, TaCN, WCN, Ru, Re, RuO, Pt, Ir, IrO, Ti, TiAlN, TaAlN, W, WN, C, Si, Ge, SiGe and NbCN. The electrodes can be a combination of one or more conducting layers. It is understood that one of the electrode described herein can be a substrate.

The ferroelectric material and the antiferroelectric material as used herein, refers to a material that is at least partially in a ferroelectric state or antiferroelectric state and further comprises, as main components, oxygen and any of the group consisting of Hf, Zr and (Hf, Zr). For example, the ferroelectric material may comprise any of $HfO_2$, $ZrO_2$, any ratio of Hf and Zr combined with oxygen (e.g., $Zr_xHf_{1-x}O_2$, where x<1) as well as any combinations thereof. In addition, the term "main components," as used herein, refers to any suitable number of O and any one or combinations of Hf, Zr and (Hf, Zr) per volumetric content, e.g., unit cell, that is higher compared to any other components or further additives introduced in any suitable manner into a ferroelectric material oxide layer.

The antiferroelectric material can be of a field induced ferroelectric type of layer comprising $Zr_aX_bO_2$, with X being an element of the periodic table with a smaller ionic radius than Zr and a>0, b>0. Suitable X elements can be one of Hf, Si, Al, Ge, elements of the second group of the periodic table and a>0, b>0. In addition to this combination, the antiferroelectric material layer may comprise $Hf_aX_bO_2$, with X being an element of the periodic table with a smaller ionic radius than Hf and a>0, b>0. Suitable elements for this combination can be one of the elements within the second group of periodic table (Zr, Si, Al, Ge) where the a>0, b<0 as before.

Another possibility for the antiferroelectric material can be of a field induced ferroelectric type consisting of a pure $ZrO_2$ layer or comprising a $ZrO_2$ or $HfO_2$ based dielectric material.

A third possibility for the antiferroelectric material can be of a relaxor type ferroelectric material (e.g., $BaTiO_3$ or $PbMg_{1/3}Nb_{2/3}O_3$). And a fourth possibility for the antiferroelectric material can be of an antiferroelectric type material like $PbZrO_3$.

The dielectric material having positive capacitance comprise from $SiO_2$, $Al_2O_3$ or rare earth oxides.

For the MFIM or MIFM structure the electrode layer can be deposited via any suitable process over a support structure. Some examples of formation processes that can be used to form conductive layers include atomic layer deposition (ALD), metal organic atomic layer deposition (MOALD), chemical vapor deposition (CVD), metal organic chemical vapor deposition (MOCVD), physical vapor deposition (PVD), or any other suitable deposition technique that facilitates formation of the conductive layers utilizing one or more suitable conductive materials as previously described herein. The conductive layer can be formed having a suitable thickness dimension, e.g., in the range from about 2 nm to about 5000 nm. In an example embodiment, the thickness range for conductive layer can be within the range from about 2 nm to about 500 nm or in a range from about 2 nm to about 50 nm.

In each embodiment, the dielectric layer and the polarizable layer can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer including the polarizable material as described herein (i.e., oxygen and at least one of Hf and Zr), where growth of each layer can be single-crystalline, poly-crystalline or amorphous with a later crystallization through a thermal process. Any suitable number and types of precursors may be utilized to introduce elements such as Hf and Zr into the layer utilizing any of the deposition techniques as described herein. The dielectric layer and the polarizable layer is formed to have a suitable thickness, e.g., in the range from about 2 nm to about 5000 nm. In an example embodiment, the thickness range for of both layers can be within the range from about 2 nm to about 500 nm or in a range from about 2 nm to about 50 nm.

What is claimed is:

1. An integrated circuit element comprising:
   a first electrode;
   a second electrode;
   a first dielectric layer having positive capacitance and disposed between the first and second electrodes; and
   a second dielectric layer adjacent to the first dielectric layer and comprising a polarizable material, the first dielectric layer being thicker than the second dielectric layer.

2. The integrated circuit element of claim 1, wherein the polarizable material is a ferroelectric material, and charges are located at an interface between the first and second dielectric layers.

3. The integrated circuit element of claim 2, wherein fixed positive or fixed negative charges are located at the interface between the first and second dielectric layers, with a charge density on the order of the remanent polarization of the ferroelectric material.

4. The integrated circuit element of claim 3, wherein charges between 5 $\mu C/cm^2$ and 50 $\mu C/cm^2$ are located between the first and second dielectric layers.

5. The integrated circuit element of claim 4, wherein charges less than 1 $\mu C/cm^2$ are located between the first and second dielectric layers.

6. The integrated circuit element of claim 1, wherein the polarizable material is an antiferroelectric or relaxor type material.

7. The integrated circuit element of claim 1, wherein one of the first and second electrodes is a substrate.

8. The integrated circuit element of claim 1, wherein the first and second electrodes comprise at least one of the group consisting of: TiN, TaN, TaCN, WCN, Ru, Re, RuO, Pt, Ir, IrO, Ti, TiAlN, TaAlN, W, WN, C, Si, Ge, SiGe and NbCN.

9. The integrated circuit element of claim 1, wherein the first dielectric layer comprises $Al_2O_3$, $SiO_2$ or $HfO_2$.

10. The integrated circuit element of claim 1, wherein the ferroelectric material comprises as main components, oxygen and any of the group consisting of Hf, Zr and (Hf,Zr).

11. The integrated circuit element of claim 1, wherein the integrated circuit element is a capacitor or a transistor structure.

12. The integrated circuit element of claim 1, wherein the integrated circuit element is a storage device or a logic device.

13. The integrated circuit element of claim 1, wherein the integrated circuit element is a piezoelectric device or a pyroelectric device.

14. The integrated circuit element of claim 1, wherein the integrated circuit element is an energy storage device.

15. An integrated circuit element comprising:
   a first electrode;
   a second electrode;
   a first dielectric layer having positive capacitance and disposed between the first and second electrodes; and
   a second dielectric layer adjacent to the first dielectric layer and comprising a polarizable material at least partially in a differential negative capacitance state, wherein the polarizable material is an antiferroelectric or relaxor type material.

16. The integrated circuit element of claim 15, wherein the ferroelectric material comprises as main components, oxygen and any of the group consisting of Hf, Zr and (Hf,Zr).

17. An energy storage element comprising:
a first electrode;
a second electrode;
a first dielectric layer having positive capacitance and disposed between the first and second electrodes; and
a second dielectric layer adjacent to the first dielectric layer and comprising a polarizable material, the first dielectric layer being thicker than the second dielectric layer.

18. The energy storage element of claim 17, wherein the polarizable material is a ferroelectric material, and fixed positive or negative charges are located at an interface between the first and second dielectric layers with a charge density on the order of the remanent polarization of the ferroelectric material.

19. The energy storage element of claim 17, wherein the polarizable material is an antiferroelectric or relaxor type material.

20. The energy storage element of claim 19, wherein charges less than 1 $\mu C/cm^2$ are located between the first and the second dielectric layers.

21. The energy storage element of claim 17, wherein more than 50% of stored energy is stored in the first dielectric layer.

22. An energy storage element comprising:
a first electrode;
a second electrode;
a first dielectric layer having positive capacitance and disposed between the first and second electrodes; and
a second dielectric layer adjacent to the first dielectric layer and comprising a polarizable material that is at least partially in a differential negative capacitance state, wherein the polarizable material is an antiferroelectric or relaxor type material.

23. The energy storage element of claim 22, wherein more than 50% of stored energy is stored in the first dielectric layer.

* * * * *